(12) United States Patent
Wen-Peng et al.

(10) Patent No.: US 6,663,720 B2
(45) Date of Patent: Dec. 16, 2003

(54) METHOD OF PREVENT AN ETCHER FROM BEING ERODED

(75) Inventors: Chiang Wen-Peng, Hsinchu (TW); Hsu Ching-Ho, Hsinchu (TW)

(73) Assignee: Mosel Vitelic Inc., Hsinch (TW)

( * ) Notice: Subject to any disclaimer, the term of this patent is extended or adjusted under 35 U.S.C. 154(b) by 96 days.

(21) Appl. No.: 09/888,397

(22) Filed: Jun. 26, 2001

(65) Prior Publication Data

US 2002/0074018 A1 Jun. 20, 2002

(30) Foreign Application Priority Data

Dec. 14, 2000 (TW) ........................... 89126814 A

(51) Int. Cl.⁷ ................................ B08B 3/04
(52) U.S. Cl. ..................... 134/2; 134/3; 134/22.13; 134/22.17; 134/26; 134/28; 134/36; 134/41; 438/690; 216/87; 427/430.1; 427/435; 427/443.2
(58) Field of Search .................. 216/87; 427/430.1, 427/435, 443.2; 134/2, 3, 22.13, 22.17, 26, 28, 36, 41; 438/690

(56) References Cited

U.S. PATENT DOCUMENTS

| | | | | |
|---|---|---|---|---|
| 5,007,981 A | * | 4/1991 | Kawasaki et al. | 134/1.2 |
| 5,158,644 A | * | 10/1992 | Cheung et al. | 438/694 |
| 5,356,478 A | * | 10/1994 | Chen et al. | 134/1 |
| 5,849,092 A | * | 12/1998 | Xi et al. | 134/1.1 |
| 6,255,222 B1 | * | 7/2001 | Xia et al. | 438/710 |
| 6,283,130 B1 | * | 9/2001 | Tamura | 134/1.1 |
| 6,322,714 B1 | * | 11/2001 | Nallan et al. | 216/67 |
| 6,379,575 B1 | * | 4/2002 | Yin et al. | 216/67 |
| 2002/0046991 A1 | * | 4/2002 | Smith et al. | 219/121.57 |
| 2002/0074018 A1 | * | 6/2002 | Chiang et al. | 134/2 |
| 2002/0117472 A1 | * | 8/2002 | Sun et al. | 216/68 |

* cited by examiner

*Primary Examiner*—Sharidan Carrillo
(74) *Attorney, Agent, or Firm*—Troxell Law Office PLLC

(57) ABSTRACT

A method of prevention maintenance preventing parts of an etcher from being eroded is disclosed. First, a layer of hydrogen-free chemical compound is formed on surface of the parts of the etcher according to one embodiment of the present invention. Otherwise, the parts of the etcher are immersed into a tank containing hydrogen-free chemical compound according to another embodiment of the present invention. After that, a standard process of prevention maintenance is performed by a cleaning agent.

7 Claims, No Drawings

METHOD OF PREVENT AN ETCHER FROM BEING ERODED

BACKGROUND OF THE INVENTION (1) Field of the Invention

The present invention relates generally to a method of preventing an etcher from being eroded, and more particularly, to a method of prevent parts of an etcher from being eroded.

(2) Description of the Related Art

Integrated circuit (IC) technology has produced dramatic advances over the past 30 years. During the manufacturing process, a several of techniques, such as deposition, etching, photolithography, and ion implantation, are applied over and over to form devices and circuits on a semiconductor substrate. The deposition techniques are performed to form dielectric or conductive films. The photolithography technique is used to replicate circuit and device features, and the desired pattern is transferred by means of the etching techniques.

There are two kinds of etching techniques in the semiconductor industry, e.g. wet etching process and dry etching process. In order to avoid the undercut effect and enhance the precision of pattern, dry etching process which is able to provide anisotropic etching is widely applied in ULSI manufacturing. Dry etching is synonymous with plasma-assisted etching, which encompasses several techniques that use plasma in the form of low-pressure gas discharges.

In the late 1970s, a new etching technique, reactive ion etching (RIE), was disclosed. In this etching process, the wafer is placed on an RF capacitive-coupled bottom electrode, which is considerably smaller than the grounded part of the system. The etch selectivity of RIE technology can be improved by choosing the proper etch chemistry, for example, by polymerizing the silicon surface with fluorocarbon polymers to obtain selectivity of $SiO_2$ over silicon.

According to the RIE etching technique, silicon oxide is etched by means of $CHF_3$ or $CF_4$ as etchant. On the other hand, chlorine-based chemistry has generally been used for Al etching, and bromine-based chemistry has been investigated recently.

$Cl_2$ is generally used to etch clean aluminum for forming vias in an etcher. Chlorine has a very high chemical etch rate with aluminum and tends to produce an undercut during aluminum etching. Moreover, carbon-containing gas is added to form organic sidewall passivation during aluminum etching to obtain etch directionality. However, the organic material is formed not only on the sidewall of the vias, but also on the inner wall of the etcher. The organic material (including chlorine gas) attached on the inner wall of the etcher forms particle source of contamination, so that the high vacuum for performing the etching process is not able to achieve.

In order to remove the residual organic material (including chlorine gas) on the parts and the inner wall of the etcher, a cleaning step is needed by using $H_2O_2$ solution as cleaning agent according to the prior art. The $H_2O_2$ solution is generally 10% $H_2O_2$+water, 5% $H_2O_2$+water, or IPA+ water. However, the water in the $H_2O_2$ solution will react with the residual chlorine gas to form hydrochloric acid (HCl) during the cleaning step. The high corrosiveness of hydrochloric acid will corrode the parts of the etcher to shorten their lifetime, especially for the parts made of $Al_2O_3$.

For example, the gas ring of an etcher Alliance 9400 is made of $Al_2O_3$. According to the prior art, the gas ring of the etcher will be severely eroded after performing two times of cleaning steps. As a result, the user of the etcher needs a rich stock of parts in order for instantly exchanging. For this reason, the corrosion effect in the etcher not only increases the manufacturing cost, but also causes a risk of running out of stock.

SUMMARY OF THE INVENTION

Accordingly, it is a primary object of the present invention to provide a method of preventing parts of an etcher from being eroded.

It is another object of the present invention to provide a method of preventing an etcher from being eroded by using a hydrogen-free chemical compound.

A method of prevention maintenance preventing parts of an etcher from being eroded is disclosed in one embodiment of the present invention. First, the parts of the etcher are immersed into a tank containing hydrogen-free chemical compound. After that, a standard process of prevention maintenance is performed by means of a cleaning agent.

A method of prevention maintenance preventing parts of an etcher from being eroded is disclosed in another embodiment of the present invention. First, a layer of hydrogen-free chemical compound is formed on surface of the parts of the etcher. After that, a standard process of prevention maintenance is performed by means of a cleaning agent.

The present invention further discloses a method of using perfluorohexane ($C_6F_{14}$) solution, wherein the method is to form a layer of perfluorohexane ($C_6F_{14}$) on a surface of a spare part of an etcher as a protection layer, whereby the layer of perfluorohexane ($C_6F_{14}$) can avoid the spare part from being eroded by hydrochloric acid.

PREFERRED EMBODIMENTS

The present invention relates generally to a method of preventing an etcher from being eroded, and more particularly, to a method of prevent parts of an etcher from being eroded.

During a process of prevention maintenance for an etcher, parts of the etcher are first coated with a hydrogen-free chemical compound. The hydrogen-free chemical compound contains perfluorocarbons (PFC) solution, such as perfluorohexane ($C_6F_{14}$) solution. Thereafter, the standard process of prevention maintenance by a cleaning agent such as DI water, IPA, or $H_2O_2$ solution is performed. Due to the hydrogen-free chemical compound serves as a protection layer to isolate the cleaning agent, the residual chlorine gas on the surface of the parts wouldn't contact with the cleaning agent. For this reason, the induced-hydrochloric acid in the prior art is thus avoided.

According to one embodiment of the present invention, when the prevention maintenance step begins, the perfluorocarbons solution is first poured into a tank, and the parts of the etcher are next put into the tank. A protection layer is thus formed on the surface of each spare part.

According to another embodiment of the present invention, when the prevention maintenance step begins, each spare part of the etcher is directed coated with the perfluorocarbons solution to form a protection layer on its surface.

Perfluorocarbon is a compound containing carbon and fluorine only. Actually, perfluorinated carbons are volatile, linear, branched chain or cyclic perfluorinated carbons (C1 up to C6, fully saturated).

Originally, CFCs are the most popular dielectric coolant. However, due to their harmful effect on the Earth's ozone layer, CFCs are replaced by perfluorocarbons, such as 3M PF-5060. 3M PF-5060 is non-irritating to the eyes and skin, and is practically non-toxic orally. The product also demonstrates very low acute and sub-chronic inhalation toxicity. It is not a mutagen, or cardiac sensitizer.

In accordance with the present invention, a new use of $C_6F_{14}$ is disclosed. The key feature of the present invention is that perfluorohexane ($C_6F_{14}$) is stable and doesn't interact with chlorine gas. After a film of perfluorohexane is formed on the parts of the etcher, a protection layer is formed to avoid the residual chlorine gas on the surface of the parts from contacting water. For this reason, no hydrochloric acid (HCl) will induce during the prevention maintenance process.

The parts of the etcher have to be changed every two weeks according to the prior art. On the other hand, in accordance with the present invention, the parts of the etcher can be used for a duration more that half a year. As a result, the lifetime of spare parts of an etcher is largely promoted according to the present invention. The method of the present invention not only saves cost for purchasing parts of an etcher, but also improves the efficiency of prevention maintenance.

Another key feature of the present invention is to disclose a new application of perfluorohexane ($C_6F_{14}$). According to the prior art, CFC is replaced by perfluorohexane ($C_6F_{14}$) solution that serves as coolant. The new application according to the present invention is to form a layer of perfluorohexane ($C_6F_{14}$) on a surface of a spare part of an etcher as a protection layer, whereby the layer of perfluorohexane ($C_6F_{14}$) can avoid the spare part from being eroded by hydrochloric acid.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What we claimed is:

1. A method of preventing parts of an etcher from being eroded, said method comprising:

a) immersing said parts of said etcher into a perfluorocarbon (PFC) solution which serves as a protective layer formed on the surface of said parts of said etcher to inhibit the interaction of chlorine residue present in said etcher with water from a subsequent cleaning step for said etcher, thereby preventing the formation of hydrochloric acid by said chlorine residue and said water; and b) performing said subsequent cleaning step to remove said chlorine residue present in said etcher.

2. The method of claim 1, wherein said perfluorocarbon (PFC) solution is a perfluorohexane ($C_6F_{14}$) solution.

3. A method of preventing parts of an etcher from being eroded, said method comprising:

a) coating on the surface of said parts of said etcher a perfluorocarbon (PFC) solution which serves as a protective layer to inhibit the interaction of chlorine residue Present in said etcher with water from a subsequent cleaning step for said etcher, thereby preventing the formation of hydrochloric acid by said chlorine residue and said water; and b) performing said subsequent cleaning step to remove said chlorine residue present in said etcher.

4. The method of claim 3, wherein said perfluorocarbons (PFC) solution is a perfluorohexane ($C_6F_{14}$) solution.

5. A method of using a perfluorohexane ($C_6F_{14}$) solution, wherein said method comprises forming a layer of perfluorohexane ($C_6F_{14}$) on a surface of a part of an etcher as a protective layer to inhibit the interaction of a residual chlorine present in said etcher with water from a subsequent cleaning step for said etcher, thereby preventing the formation of hydrochloric acid by said residual chlorine and said water.

6. The method of claim 5, wherein said layer of perfluorohexane ($C_6F_{14}$) is formed by directly coating said perfluorohexane ($C_6F_{14}$) solution on said part.

7. The method of claim 5, wherein said layer of perfluorohexane ($C_6F_{14}$) is formed by immersing said part into a tank containing said perfluorohexane ($C_6F_{14}$) solution.

* * * * *